US011812072B2

(12) United States Patent
Mahoney et al.

(10) Patent No.: US 11,812,072 B2
(45) Date of Patent: Nov. 7, 2023

(54) NODE HOUSING WITH LID-BASED MOUNTING OF NODE COMPONENTS FOR USE IN A BROADBAND DISTRIBUTION NETWORK

(71) Applicant: Applied Optoelectronics, Inc., Sugar Land, TX (US)

(72) Inventors: William G. Mahoney, Suwanee, GA (US); Simon Farfoud, Hoschton, GA (US); Steve Blashewski, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 60 days.

(21) Appl. No.: 17/533,642

(22) Filed: Nov. 23, 2021

(65) Prior Publication Data

US 2023/0164367 A1 May 25, 2023

(51) Int. Cl.
*H05K 5/00* (2006.01)
*H04N 21/226* (2011.01)
*H05K 5/02* (2006.01)
*H05K 7/20* (2006.01)

(52) U.S. Cl.
CPC ......... *H04N 21/226* (2013.01); *H05K 5/0004* (2013.01); *H05K 5/0247* (2013.01); *H05K 7/20409* (2013.01)

(58) Field of Classification Search
CPC .. H04N 21/226; H05K 5/0004; H05K 5/0247; H05K 7/20409
See application file for complete search history.

(56) References Cited

U.S. PATENT DOCUMENTS

| 5,668,911 A * | 9/1997 | Debortoli | G02B 6/4446 385/135 |
| 6,530,088 B1 * | 3/2003 | Brickell | H04B 3/04 725/127 |
| 7,711,235 B2 * | 5/2010 | Riggsby | G02B 6/4471 385/135 |
| 7,719,849 B2 * | 5/2010 | Blashewski | H05K 5/0026 361/752 |
| 8,020,813 B1 * | 9/2011 | Clark | G02B 6/445 248/74.2 |

(Continued)

OTHER PUBLICATIONS

Cisco, Cisco GS7000 1218-MHz 4-Way Segmentable Node Data Sheet, 2016, pp. 1-7. (Year: 2016).*

*Primary Examiner* — Abhishek M Rathod
*Assistant Examiner* — Keith DePew
(74) *Attorney, Agent, or Firm* — Grossman Tucker Perreault & Pfleger, PLLC; Norman S. Kinsella

(57) ABSTRACT

An aspect of the present disclosure includes a node housing for use in a broadband distribution network that includes coupling the amplifier to a lid portion and providing an interface plate in a base portion that allows for RF and power signals to be provided to the RF amplifier within the lid portion. The interface plate disposed within the base portion further preferably provides power pass-through to downstream nodes that remains electrically connected even when the amplifier is decoupled from the lid portion. Thus, the amplifier and/or lid portion may be decoupled from the base portion without disrupting power distribution to the downstream nodes.

16 Claims, 8 Drawing Sheets

(56) References Cited

U.S. PATENT DOCUMENTS

| | | | | |
|---|---|---|---|---|
| 8,879,882 B2* | 11/2014 | Conner | ............... | G02B 6/4471 |
| | | | | 385/134 |
| 10,031,306 B2* | 7/2018 | Sadasivan | ............ | G02B 6/4446 |
| 10,353,163 B1* | 7/2019 | Hanks | .................. | G02B 6/4448 |
| 10,509,187 B2* | 12/2019 | Carapella | ............... | H02G 3/083 |
| 10,779,423 B2* | 9/2020 | Laughlin | .............. | H05K 5/0217 |
| 10,809,478 B2* | 10/2020 | Sadasivan | .............. | G02B 6/445 |
| 10,931,039 B2* | 2/2021 | Mahoney | ............. | H05K 5/0021 |
| 10,976,512 B2* | 4/2021 | Carapella | ............... | H02G 3/086 |

\* cited by examiner

NODE HOUSING WITH LID-BASED MOUNTING OF NODE COMPONENTS FOR USE IN A BROADBAND DISTRIBUTION NETWORK

TECHNICAL FIELD

The present disclosure relates generally to broadband distribution networks, and more particularly, to a node housing that maintains a target operational temperature within the same based on a lid-mounted arrangement of node components, and preferably, node components such as a radio frequency (RF) amplifier.

BACKGROUND INFORMATION

Existing broadband distribution networks, such as cable television (CATV) networks, utilize a head/hub that communicates signals to subscribers via one or more feed lines. Each feeder line is associated with one or more service groups that can provide signals, such as CATV signals, to associated subscribers. Generally, subscribers are associated with a particular service group based on their home or business's geographic location.

In the context of a CATV network, each feeder line generally includes a plurality of components/nodes such as splitters, taps, and amplifier nodes that collectively enabled downstream CATV signals to reach subscribers as well as for upstream signals to be sent from subscribers to target destinations, e.g., an Internet endpoint.

BRIEF DESCRIPTION OF THE DRAWINGS

These and other features and advantages will be better understood by reading the following detailed description, taken together with the drawings wherein.

DETAILED DESCRIPTION

Nodes such as amplifier nodes are often implemented via a clamshell housing with a base and rotatably coupled cover. The base includes amplifier circuitry and receptacles for coupling with, for instance, coaxial cable(s) and power interconnects for coupling to power lines such as AC mains. Power distribution via a node is generally in series whereby each node along a feed line provides power to the following node in a pass-through manner.

Present approaches to such node housing includes coupling the amplifier circuitry as close as possible, i.e., within the base, to the coaxial cable receptacles to avoid signal loss and introduction of noise. This results in power supply circuitry being disposed in the cover portion and electrical coupling with the power interconnect in the base being via a channel/riser. Removal of the amplifier circuitry for maintenance or upgrades, for instance, unfortunately disconnects power to down-stream nodes on a feed line as the amplifier circuitry is a single unit that not only includes the amplifier-specific circuitry but the power interconnect to allow a power signal to be passed through the base to supply power to down-stream nodes.

Figure 1:
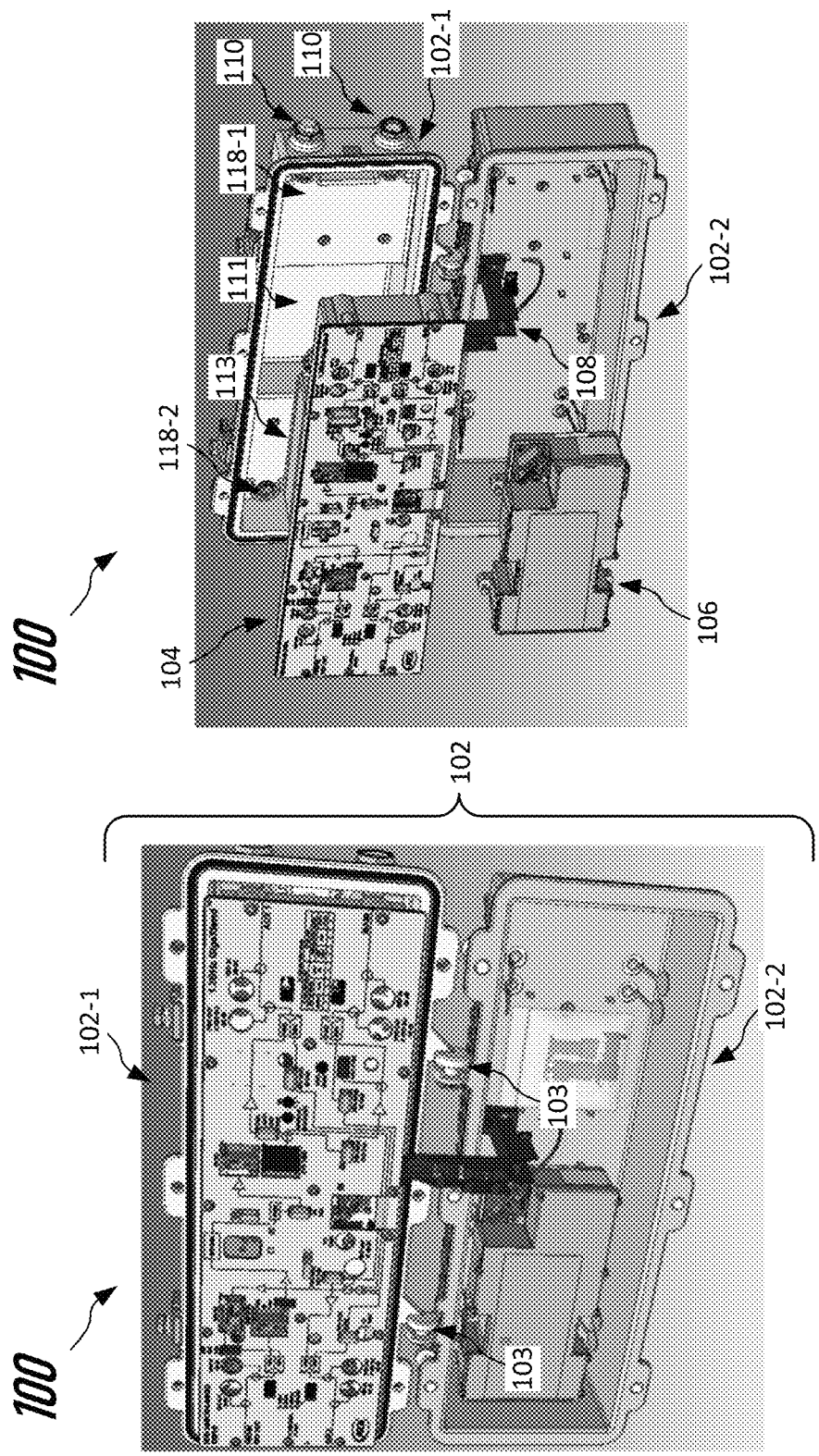
FIG. 1A shows an example existing amplifier node for use in a broadband distribution network.
FIG. 1B shows an exploded view of the amplifier node of FIG. 1A.

For example, FIGS. 1A and 1B show one such example node 100 of a CATV network implemented as an amplifier node. The node 100 includes a housing shown collectively at 102 and individually as a first housing portion 102-1 and a second housing portion 102-2. The first housing portion 102-1 and the second housing portion 102-2 can couple together via a hinge 103 and define a cavity therebetween, which may also be referred to as a component cavity.

The first housing portion 102-1 of the node 100 includes RF connector ports 110 for coupling to a coaxial cable of a feed line as well as power interconnects/receptacles to provide power to loads within the node 100. The first housing portion 102-1 further preferably includes an amplifier 104 disposed therein, which may also be referred to as an RF amplifier. The first housing portion 102-1 further provides a recess 111 for receiving a portion 113 of the amplifier 104. This configuration allows for the portion 113 of the amplifier to be disposed between the sections of the first housing portion 102-1 that provides the assemblies to support coaxial pin seizure and power interconnections shown generally at 118-1 and 118-2.

The portion 113 can provide additional space/footprint within the amplifier 104 to house circuitry for amplification of an RF signal and/or for power pass-through. The first housing portion 102-1 can include mounts (not shown) to couple to a building or other suitable structure. The first housing portion 102-1 may also be referred to herein as a base.

The second housing portion 102-2 includes a power supply 106 disposed therein for receiving power, e.g., AC main, and providing power to loads such as the amplifier 104 via a riser 108. The second housing portion 102-2 may also be referred to herein as a cover. Covers tend to have a greater internal volume than the internal volume of an associated base.

In operation, power flows through the node 100 via power interconnections shown generally at 118-1 and 118-2, with the amplifier 104 providing power passthrough circuitry to supply power to downstream nodes, and to loads within the node 100. Removal of the amplifier 104 then electrically decouples the power interconnect circuitry, and thus by extension, disrupts/disconnects power distribution to downstream nodes. This can ultimately result in loss of service for one or more service groups serviced by the impacted downstream nodes until the amplifier 104 (or a replacement) is electrically coupled into the node 100.

An aspect of the present disclosure includes a node housing for use in a broadband distribution network that includes coupling/mounting the amplifier to a lid portion (also referred to herein as a cover portion) and providing an interface plate in the base portion that allows for RF and power signals to be provided to the RF amplifier within the lid portion. The base portion preferably includes receptacles, such as the RF connector ports 110, to couple to a feedline, and preferably a coaxial cable of a feedline to send/receive RF signals (e.g., CATV signals). Preferably, the base portion includes a recess such as the amplifier recess discussed above with regard to FIGS. 1A and 1B. However, the base preferably includes a power supply disposed in the recess defined by the base. The power supply further preferably electrically couples to external power, e.g., AC mains, via an electrical interconnect disposed in the base portion. The interface plate disposed within the base portion further preferably provides power pass-through to downstream nodes that remains electrically connected when the amplifier is decoupled from the lid portion, or the lid portion is decoupled from the base portion.

Accordingly, an amplifier node consistent with the present disclosure allows for an amplifier to be decoupled from a node, e.g., for maintenance or upgrade, without disrupting down-stream power distribution. In addition, a node consistent with the present disclosure can achieve increased heat dissipation for circuitry such as the amplifier by disposing the same in the lid rather than the base. The lid can feature a relatively larger overall internal volume that increases thermal isolation between the amplifier and adjacent circuitry such as the power supply. In addition, the lid can feature relatively larger heat sink structures such as fins to further increase thermal communication of heat from the amplifier to the surrounding environment for example. Aspects of the present disclosure has identified that this arrangement allows or increased power consumption by node components such as the amplifier, e.g., up to and beyond 80 watts, while maintaining an internal temperature of the node at or below 85 degrees Celsius through passive cooling (e.g., natural convection), which is to say without the necessity of active cooling. Thus, aspects of the present disclosure enable increased power consumption within a node to achieve production bandwidths of 1.8 Ghz and greater.

The term "coupled" as used herein refers to any connection, coupling, link or the like between elements. Such "coupled" elements are not necessarily directly connected to one another and may be separated by intermediate components.

A base or base portion means a housing portion that includes at least one RF connector port for coupling to a feedline in a broadband network. On the other hand, a lid or lid portion means a housing portion that does not have RF connector ports. Further, a base consistent with the present disclosure preferably has a first overall internal volume, V1, that is less than a second overall internal volume, V2, of an associated cover.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated/target characteristic. To provide one non-limiting numerical example to quantify "substantially," such a modifier is intended to include minor variation that can cause a deviation of up to and including ±5% from a particular target quality/characteristic unless otherwise provided by the present disclosure.

Referring to FIGS. 2-8, an example node 200 is shown consistent with aspects of the present disclosure. The node 100 is preferably implemented as an amplifier node for use broadband distribution network, such as a CATV network that comports with a DOCSIS 3.1 standard or beyond.

As shown, the node 200 preferably includes a housing shown collectively at 202 and individually as a first housing portion 202-1 and a second housing portion 202-2. The housing 202 is preferably formed from a material such as aluminum. The housing 202 preferably has an ingress protection (IP) rating of at least IP68.

The first housing portion 202-1 and the second housing portion 202-2 are preferably configured to be rotatably coupled together. More preferably, the first housing portion 202-1 and the second housing portion 202-2 are rotatably coupled by a hinge 203. The hinge 203 is preferably configured to allow the first housing portion 202-1 to rotate relative to the second housing portion 202-2 about a rotational axis 209 (See FIG. 4). The first housing portion 202-1 and the second housing portion 202-2 are preferably configured to couple together and form a node cavity therebetween. The node cavity is preferably configured to have at least one node component therein. The node cavity is preferably collectively defined by a first cavity 205-1 provided by the first housing portion 202-1 and a second cavity 205-2 provided by the second housing portion 202-2, which are discussed in further detail below.

The first housing portion 202-1 is further preferably configured to be removably coupled to the second housing portion 202-2. More preferably, the first housing portion 202-1 is removably coupled to the second housing portion 202-2 by way of the hinge 203. For example, the hinge 203 can be configured to allow for separation of the first housing portion 202-1 from the second housing portion 202-2. This advantageously allows for a technician to separate/decouple the first housing portion 202-1 and the second housing portion 202-2 from each other for purposes of maintenance and upgrades, for example. Moreover, this allows for the technician to decouple the housing portions without disrupting/interrupting power to downstream nodes based on the first housing portion 202-1 having an interruptible configuration as disclosed herein.

The first housing portion 202-1 may also be referred to as a base portion or simply a base. The first housing portion 202-1 is preferably defined by a plurality of sidewalls that define the first cavity 205-1.

The first housing portion 202-1 can include a plurality of mounts (not shown) for fixedly mounting to a wall or other suitable structure. The first housing portion 202-1 further preferably includes a planar surface 220 that can be used to, for example, mount the first housing portion 202-1 a location such as a vertical wall. The planar surface 220 can be defined at least in part by sidewalls of the first housing portion 202-1 that define a recess within the same, further description of which is provided below. The recess is preferably formed with the first housing portion 202-1 as a single, monolithic structure. This recess may also be referred to herein as a node component compartment or simply a component compartment. The component compartment is preferably disposed at a midpoint of the first housing portion 202-1. One such example component compartment 224 is shown more clearly in FIG. 4. The component compartment 224 is preferably configured to include at least one node component disposed therein, such as a power supply.

The first housing portion 202-1 further preferably includes at least one RF connector port, and more preferably, a plurality of RF connector ports 210. The plurality of RF connector ports 210 are preferably configured to couple to a coaxial cable that provides a feedline within a broadband distribution network. Each of the plurality of RF connector ports 210 can be implemented as G-type RF connectors, for example. Each of the plurality of RF connector ports 210 are preferably disposed at distal ends of the first housing portion 202-1.

The first housing portion 202-1 further preferably includes a first heatsink structure 222-1 and a second heatsink structure 222-2. The first heatsink structure 222-1 and the second heatsink structure 222-2 are preferably implemented as a plurality of fins. The fins of the first heatsink structure 222-1 and the second heatsink structure 222-2 preferably extend transverse relative to a longitudinal axis 250-1 of the first housing portion 202-1 (See FIG. 3).

Figure 3:
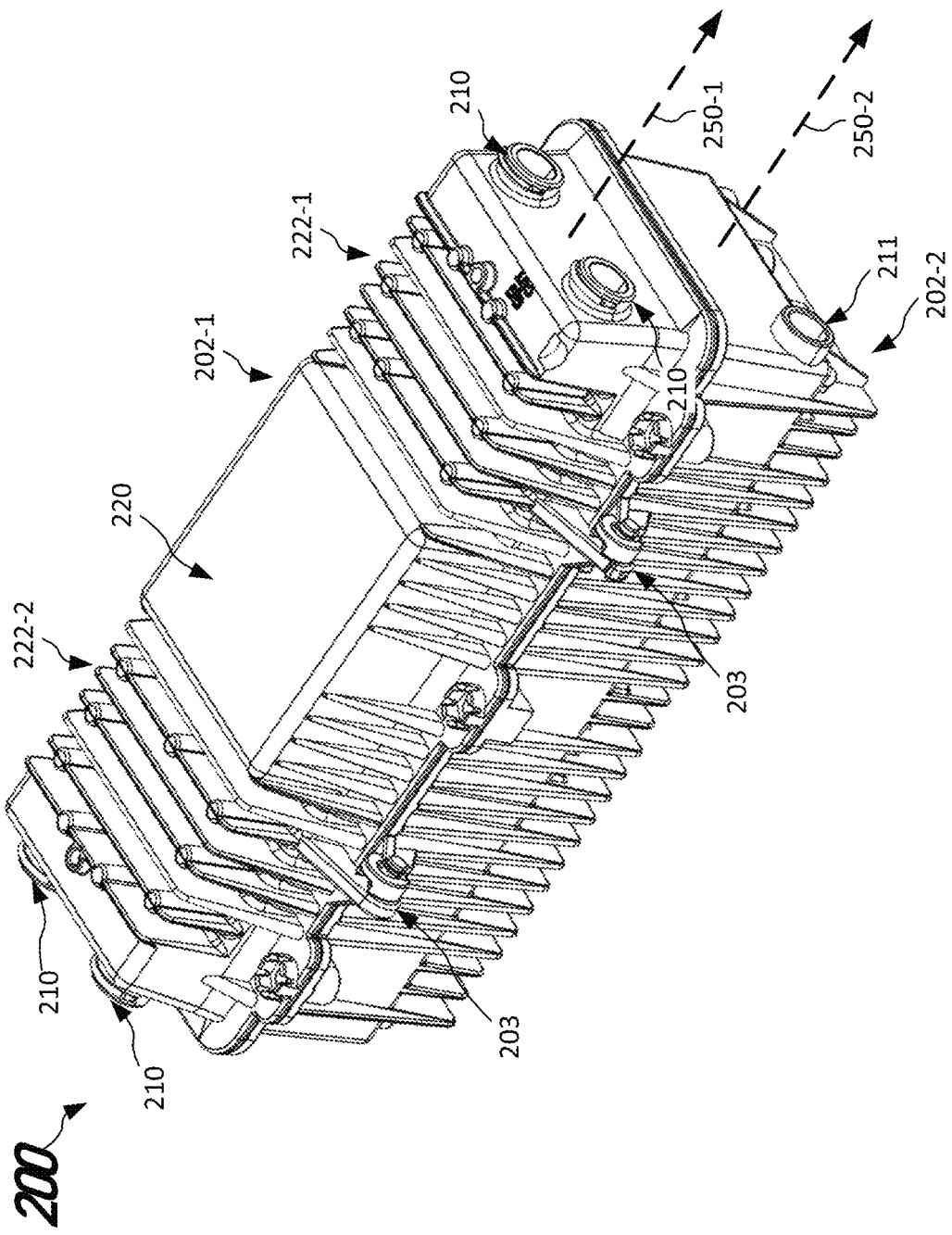
FIG. 3 shows another perspective view of the node of FIG. 2, in accordance with aspects of the present disclosure.
Figure 4:
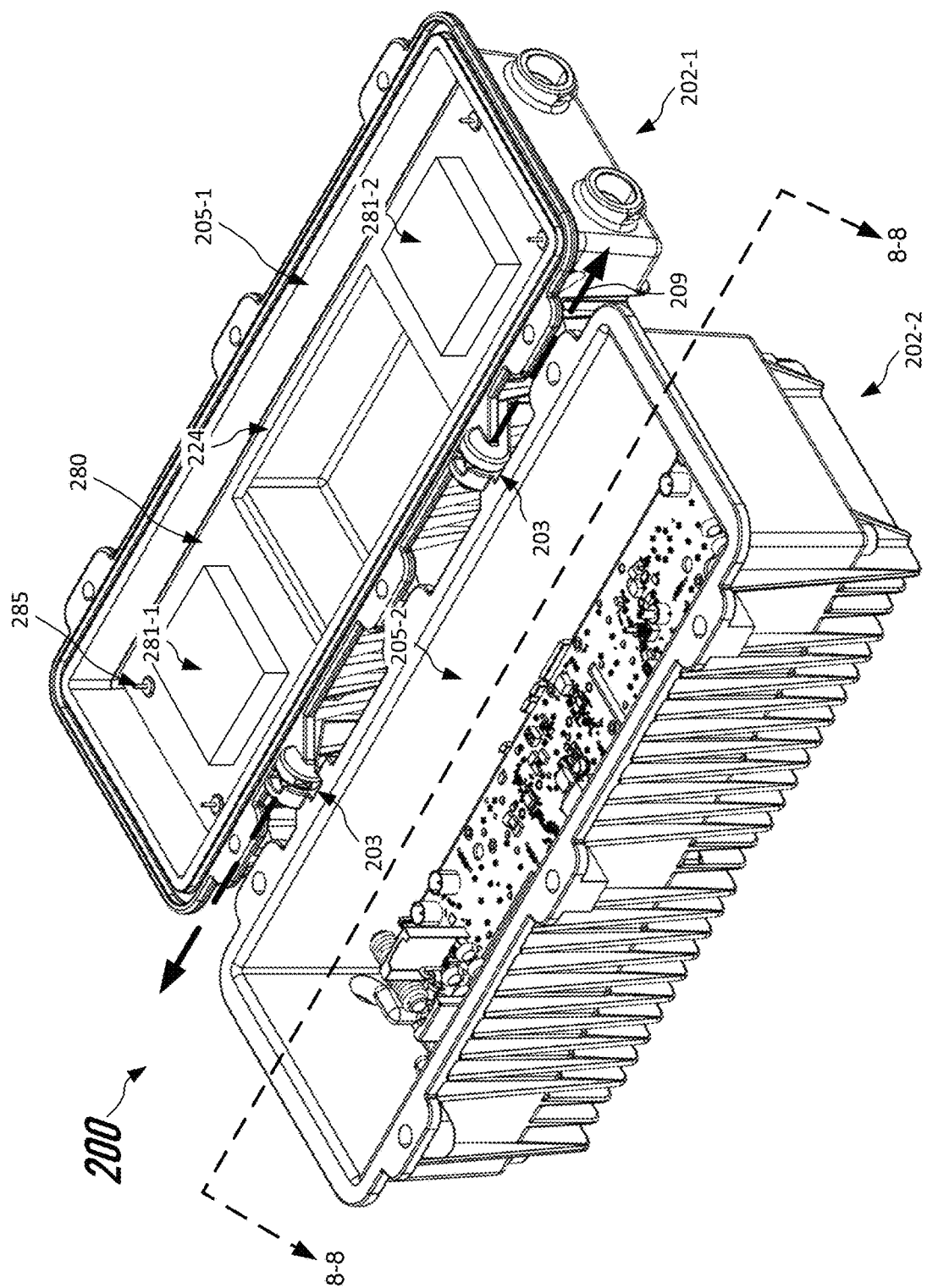
FIG. 4 shows another perspective view of the node of FIG. 2, in accordance with aspects of the present disclosure.
Figure 5:
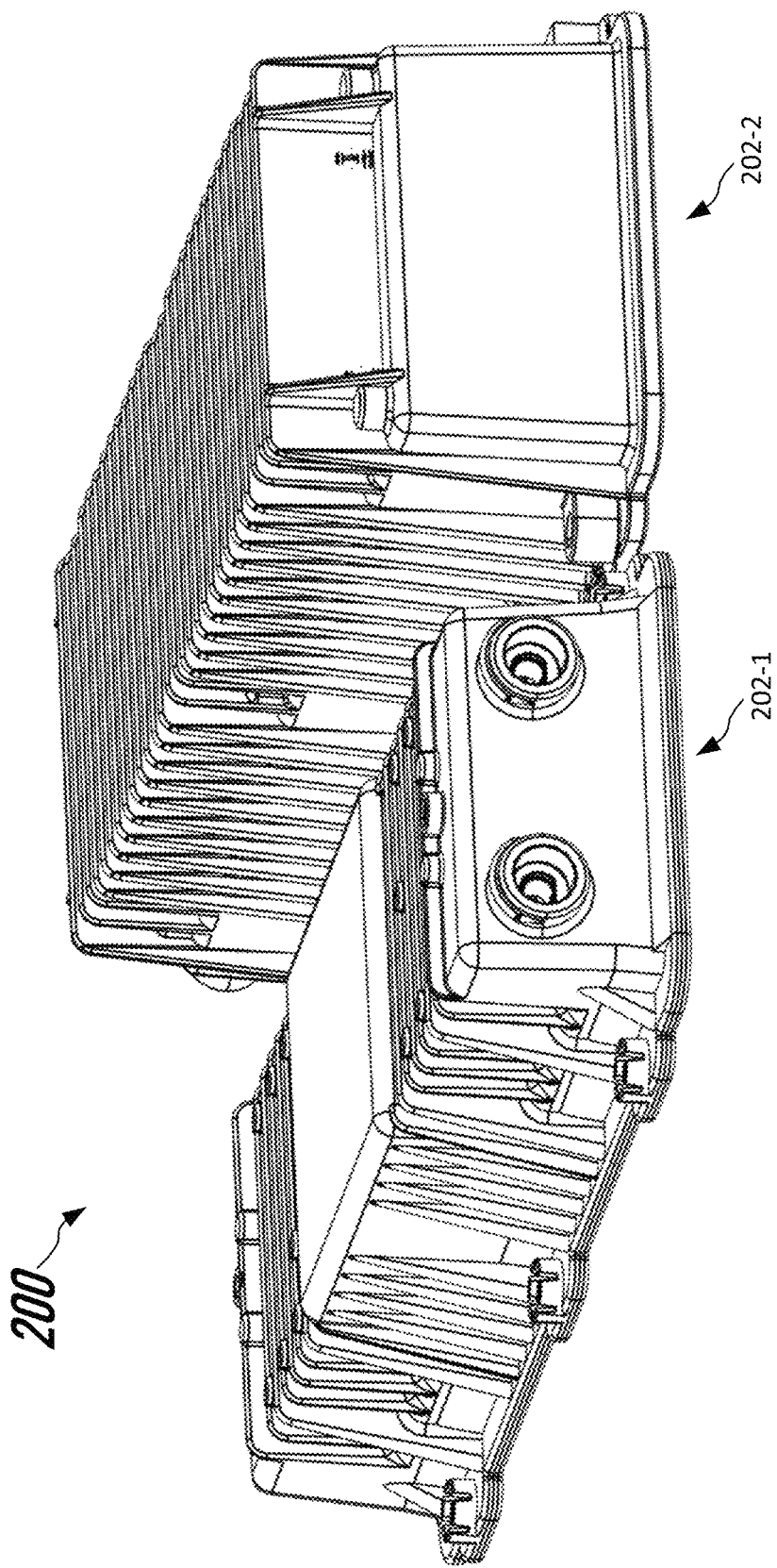
FIG. 5 shows another perspective view of the node of FIG. 2, in accordance with aspects of the present disclosure.

The first heatsink structure 222-1 and the second heatsink structure 222-2 are further preferably formed with the first housing portion 202-1 as single, monolithic piece of material. The planar surface 220 of the component compartment 224 is preferably disposed between the first heatsink structure 222-1 and the second heatsink structure 222-2. In the example of FIG. 3, this results in the first heatsink structure 222-1, the planar surface 220, and the second heatsink structure 222-2 being disposed along the longitudinal axis 250-1 of the first housing portion 202-1.

The first housing portion 202-1 preferably defines a first cavity 205-1 having an overall volume V1. The overall volume V1 of the first cavity 205-1 can be in a range of 60 to 80 cubic inches. The first cavity 205-1 further preferably includes an upper cavity, and a lower cavity that defines the component compartment 224.

Figure 6:
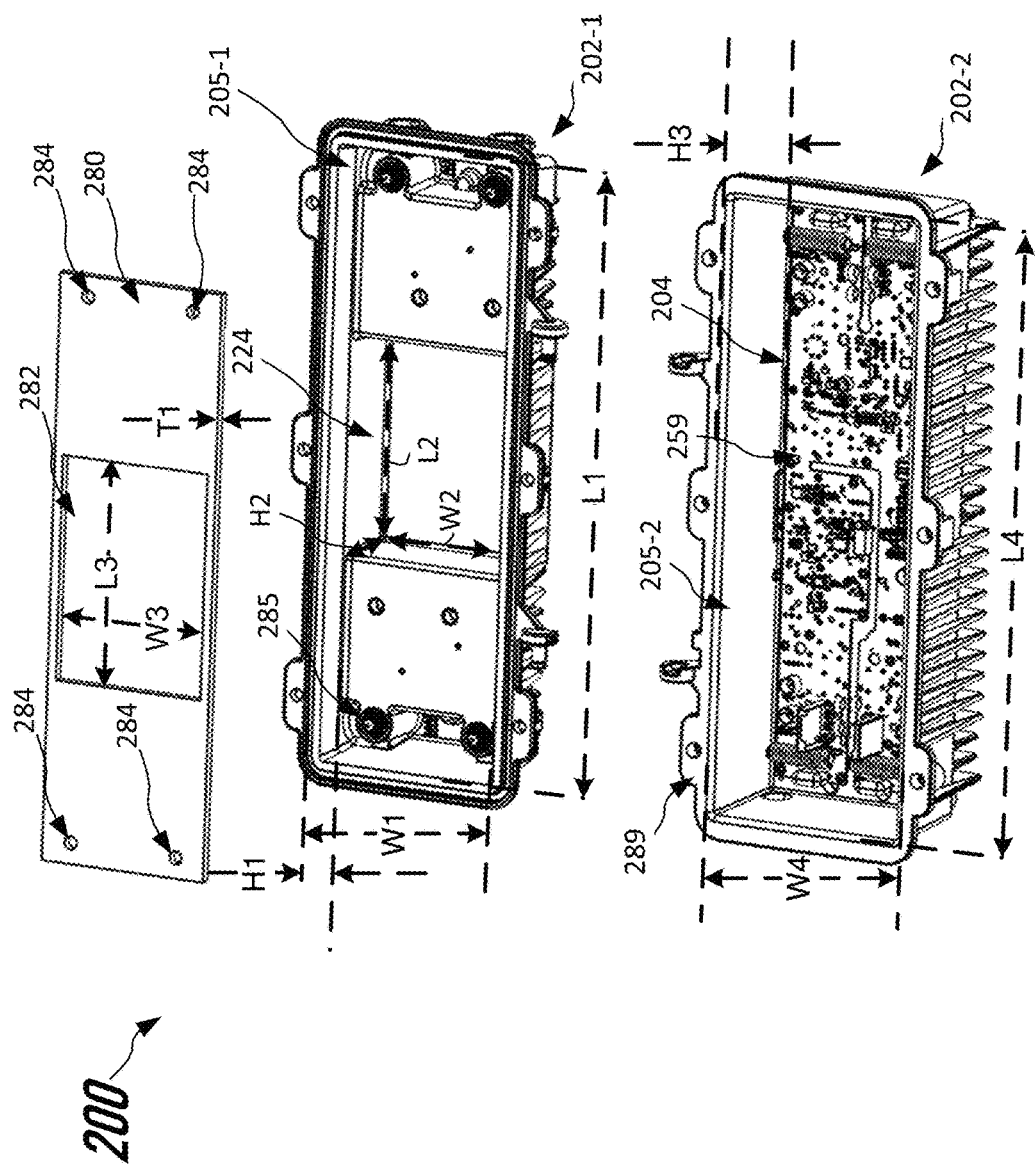
FIG. 6 shows a partially exploded view of the node of FIG. 2, in accordance with aspects of the present disclosure.

The upper cavity has an overall height H1 preferably measuring 0.81±0.5 inches, an overall length L1 preferably measuring 14.4±1.0 inches, and an overall width W1 preferably measuring 5.2±1.0 inches (see FIG. 6).

The lower cavity defining the component compartment 224 includes an overall height H2 preferably measuring 1.7±1.0 inches, an overall length L2 preferably measuring 5.1±1.0 inches, and an overall width W2 preferably measuring 5.2±1.0 inches.

Preferably, an interface plate 280 is disposed in the upper cavity defined by the first cavity 205-1. The interface plate 280 is preferably formed from a material such as aluminum, although other materials are within the scope of this disclosure such as copper. The interface plate 280 is preferably securely/fixedly coupled to the first housing portion 202-1.

The interface plate 280 preferably includes an overall length and width that is equal to or less than the overall length L1 and overall width W1 of the upper cavity. The interface plate 280 further preferably includes a height/thickness T1 measuring 0.25±0.10 inches.

The interface plate 280 further preferably defines an opening 282 with a length L3 and a width W3. The opening 282 is preferably in communication with the component compartment 224 when the interface plate 280 is disposed in the first housing portion 102-1 to allow for insertion of a node component. The length L3 of the opening 282 can be greater than, equal to, or less than the overall length L2 of the lower cavity. Preferably the length L3 of the opening 282 is equal to the overall length L2. The width W3 of the opening 282 can be greater than, equal to, or less than the overall width W2 of the lower cavity. Preferably, the width W3 of the opening 282 is equal to the overall width W2 of the lower cavity. More preferably, the width W3 and the length L3 of the opening 282 is equal to the overall width W2 and the overall length L2 of the lower cavity, respectively.

The interface plate 280 further preferably defines a plurality of apertures 284. Each aperture of the plurality of apertures 284 is preferably aligned with an electrical interconnect/electrical post provided by the RF connector assemblies disposed within the first cavity 205-1, such as electrical interconnect 285. Each of the electrical interconnects of the RF connector assemblies is preferably configured to extend through corresponding apertures of the plurality of apertures 284, such as shown by electrical interconnect 285 in the example of FIG. 4. The electrical interconnects are preferably electrically coupled to the amplifier 204 for sending/receiving RF by way of a riser 299 (See FIG. 7).

Optional circuitry/components such as a first component 281-1 and/or a second component 281-2 can be mounted to the interface plate 280. The optional circuitry can include, for example, power circuitry for providing an uninterruptable power supply to downstream nodes or other components/circuitry such as amplifiers, line extenders, and taps. In one example, the first component 281-1 can be an RF preamp and/or a RF reverse amp, and the second component 281-2 can be power circuitry to provide pass-through power to downstream nodes. This configuration may also be referred to herein as an electrical passthrough arrangement, which is preferably configured to maintain power output to downstream nodes when the amplifier 204 is electrically decoupled from the power supply 206.

Figure 7:
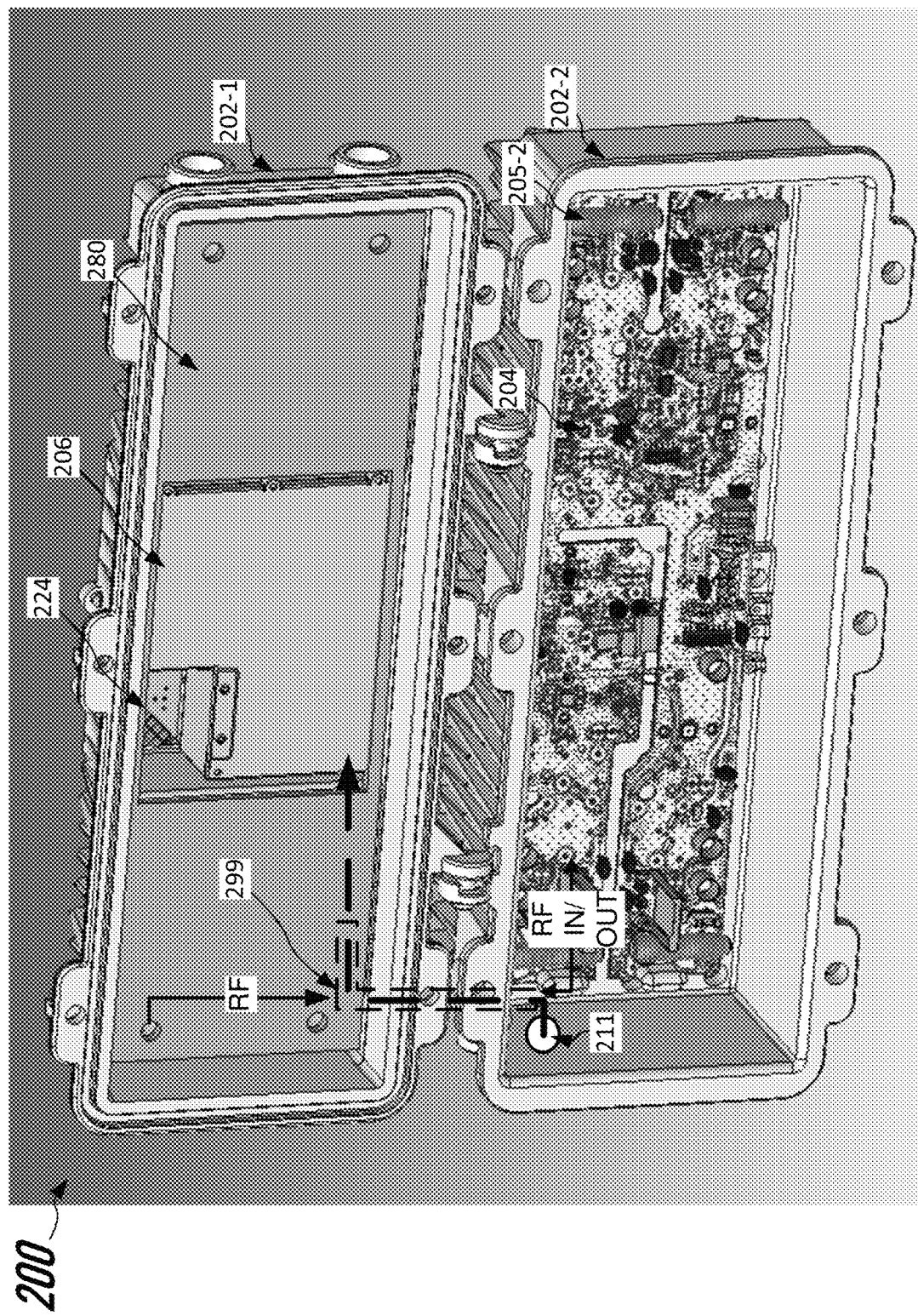
FIG. 7 shows another perspective view of the node of FIG. 2, in accordance with aspects of the present disclosure.

Preferably, a power supply 206 is disposed within the component compartment 224 (See FIG. 7). Preferably, the power supply 206 can be decoupled/removed from the component compartment 224 via the opening 282 of the interface plate 280. Accordingly, the power supply 206 can be preferably removed from the opening 282 without the necessity of decoupling/removing the interface plate 280 from the first housing portion 202-1. As shown in FIG. 7, the power supply 206 can electrically couple to external power, such as AC mains, via a power receptacle 211 defined by the second housing portion 202-2 and riser 299, for example. Further, the power supply 206 preferably electrically couples to the amplifier 204, e.g., via riser 299. Preferably, electrical decoupling of the amplifier 204 from the power supply 206 does not interrupt power to downstream nodes.

The interface plate 280 can be configured to thermally isolate components within the first housing portion 202-1 from components within the second housing portion 202-2. Alternatively, or in addition to the thermal shielding provided by the interface plate 280, the interface plate 280 can also provide RF shielding between components of the first housing portion 202-1 and the second housing portion 202-2.

The second housing portion 202-2 may also be referred to as a cover portion or simply a cover. The second housing portion 202-2 is preferably defined by a plurality of sidewalls that define the second cavity 205-2, as discussed further below.

The second housing portion 202-2 can also include a plurality of mounts (not shown) for fixedly mounting to a wall or other suitable structure. The second housing portion 202-2 further preferably includes a power receptacle 211. The power receptacle 211 can be configured to couple to power, e.g., AC mains.

Figure 2:
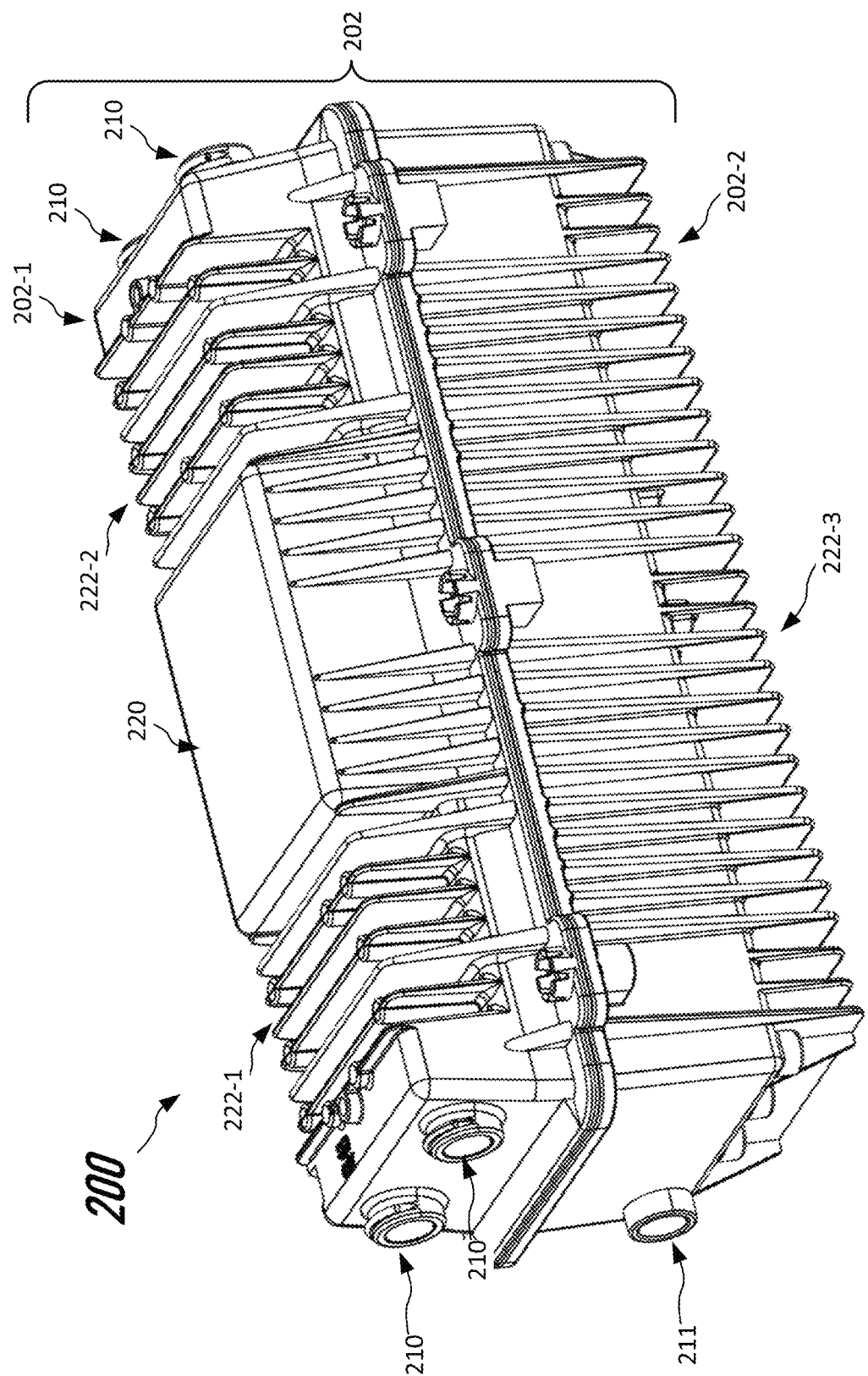
FIG. 2 shows a perspective view of an example node for use within a broadband distribution network consistent with aspects of the present disclosure.

The second housing portion 202-2 further preferably includes a third heatsink structure 222-3 (See FIG. 2). The third heatsink structure 222-3 is further preferably configured to extend along a longitudinal axis 250-2, and more preferably from end-to-end of the second housing portion 202-2 along the longitudinal axis 250-2 (See FIG. 3). The third heatsink structure 222-3 is preferably implemented as a plurality of fins. Each of the fins of the third heatsink structure 222-3 preferably extend transverse relative to the longitudinal axis 250-2 of the second housing portion 202-2.

The third heatsink structure 222-3 is further preferably formed with the second housing portion 202-2 as single, monolithic piece of material.

The second housing portion 202-2 preferably defines the second cavity 205-2. The second cavity 205-2 includes an overall volume V2. The overall volume V2 of the second cavity 205-2 is preferably at least 280 cubic inches. The overall volume V2 of the second cavity 205-2 is preferably greater than the overall volume V1 of the first cavity 205-1. Preferably, the ratio of the overall volume V2 of the second cavity 205-2 relative to the overall volume V1 of the first cavity 205-1 is 2:1.0, 2.5:1.0 or at least 1.5:1.0.

The second cavity 205-2 has an overall height H3 (see FIG. 6) that preferably measures 3.2±1.0 inches, an overall length L4 that preferably measures 14.4±1.0 inches, and an overall width W4 that preferably measures 5.2±1.0 inches (see FIG. 6).

An amplifier 204 is preferably disposed in the second cavity 205-2 of the second housing portion 102-2. More preferably, the amplifier 204 is mounted to a bottom surface 261 (see FIG. 8) that defines the second cavity 205-2 such that a first gap (e.g., an air gap) is provided between the amplifier 204 and a mating surface 289 (or upper edge) of the second housing portion 102-2 that forms an interface between the first housing portion 102-1 and the second housing portion 102-2 when coupled together.

Figure 8:
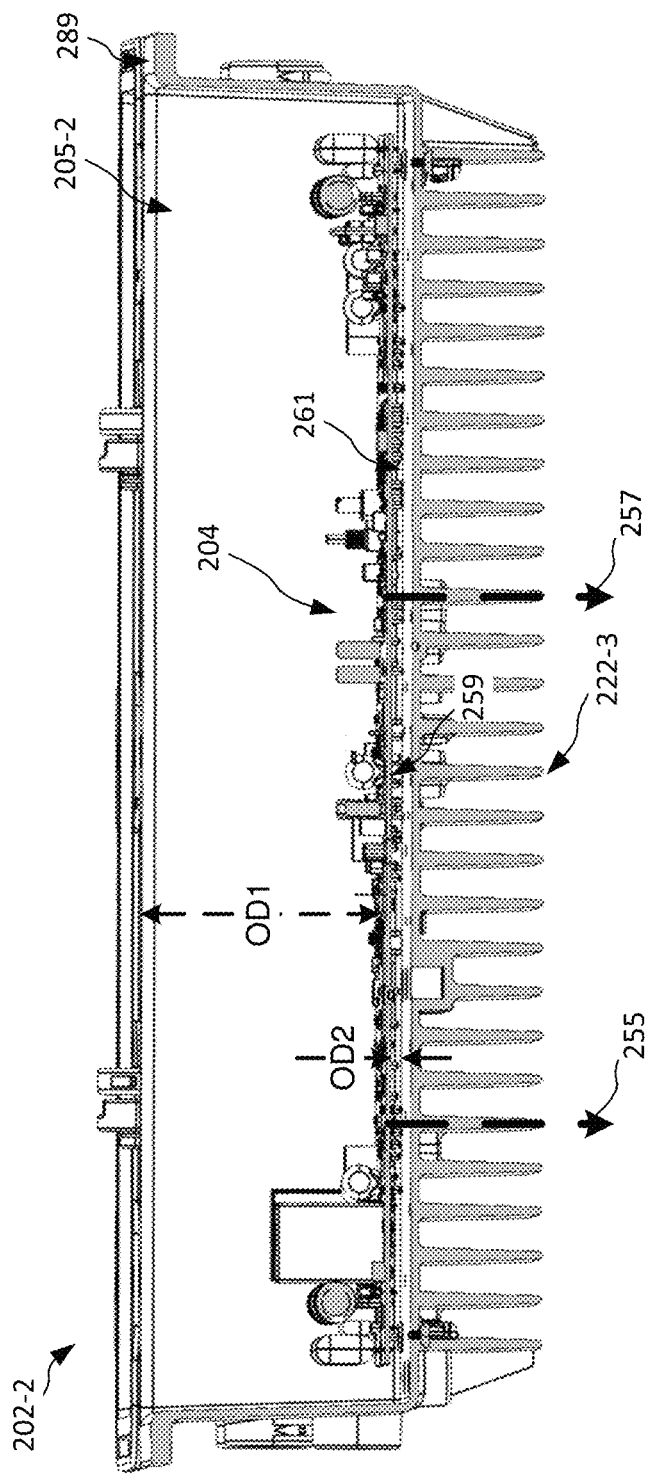
FIG. 8 shows a cross-sectional view of the node of FIG. 2 taken along line 8-8 of FIG. 4, in accordance with aspects of the present disclosure.

The amplifier 204 is preferably implemented by a printed circuit board (PCB) 259, such as shown in FIGS. 6 and 8. More preferably, the amplifier 204 is implemented via a single circuit board, although this disclosure is not limited in this regard. The PCB 259 is preferably mounted (directly) to the bottom surface 261 of the second cavity 205-2, or alternatively via a mounting structure such as rubber feet.

The first gap preferably provides an overall offset distance OD1 between the PCB 259 and the mating surface 289, which is to say between the amplifier 204 and the interface between the first housing portion 102-1 and the second housing portion 102-2. The overall offset distance OD1 preferably measures at least 3 inches.

The PCB 259 is preferably disposed at an overall offset distance OD2 from the bottom surface 261. The overall offset distance OD2 preferably measures 0.25±0.1 inches. Preferably, the offset distance OD2 between the PCB 259 and the bottom surface 261 is uniform along an entire length of the PCB 259. Preferably, the offset distance OD2 provides a second gap (e.g., an air gap).

As shown in the examples of FIGS. 6 and 8, the PCB 259 preferably does not include an associated housing/enclosure/chassis, such as the chassis shown above with regard to the amplifier 104 of FIG. 1B. This advantageously reduces the overall footprint of the amplifier 204, and can provide at least one thermal communication path, e.g., thermal communication paths 255 and 257, for communication of heat from the amplifier 204 to, for instance, the third heatsink structure 222-3 for heat dissipation purposes. The at least one thermal communication path is preferably a direct thermal communication path. A direct thermal communication path refers to a path between a first component, e.g., PCB 259, and a second component, e.g., the bottom surface 261 of the second housing portion 102-2, that does not include an intermediate medium/structure other than air. Preferably, the thermal communication paths 255, 257 extend through the third heatsink structure 222-3. Preferably, the thermal communication paths 255, 257 extend in a direction that is away from the first housing portion 102-1. More preferably, this configuration provides a plurality of such direct thermal communication paths along an entire length of the PCB 259 to increase thermal communication with the third heatsink structure 222-3 by way of bottom surface 261. For example, the thermal communication paths 255, 257 preferably extend in parallel and represent a plurality of such direct thermal communication paths along the entire length of the PCB 259.

In accordance with an aspect of the present disclosure a node for use in a broadband distribution network is disclosed. The node comprising a first housing portion that defines a first cavity, the first housing portion having at least one radio frequency (RF) connector port for coupling to a feedline of a broadband distribution network, a second housing portion that defines a second cavity, an amplifier disposed in the second cavity of the second housing portion, wherein the first housing portion and the second housing portion are configured to couple together and collectively provide a component cavity therebetween based on the first cavity and the second cavity, and wherein an overall volume V1 of the first cavity of the first housing portion is less than an overall volume V2 of the second cavity of the second housing portion.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A node for use in a broadband distribution network, the node comprising:
   a first housing portion that defines a first cavity, the first housing portion having at least one radio frequency (RF) connector port for coupling to a feedline of a broadband distribution network;
   a second housing portion that defines a second cavity;
   an amplifier disposed in the second cavity of the second housing portion; and wherein:
      the first housing portion and the second housing portion are configured to couple together and collectively provide a component cavity therebetween based on the first cavity and the second cavity, and wherein an overall volume V1 of the first cavity of the first housing portion is less than an overall volume V2 of the second cavity of the second housing portion;
      the first cavity of the first housing portion defines an upper cavity and a lower cavity; and
      a power supply disposed in the first cavity of the first housing portion and an amplifier disposed in the second cavity of the second housing portion, the amplifier electrically coupled to the power supply, and wherein circuitry mounted to an interface plate disposed in the upper cavity provides an electrical passthrough arrangement that is configured to maintain power output to downstream nodes when the amplifier is electrically decoupled from the power supply.

2. The node of claim 1, wherein the interface plate includes an opening, the opening in communication with the lower cavity and configured to allow insertion of a node component into the lower cavity.

3. The node of claim 2, wherein the node component is a power supply, and wherein the power supply is removably disposed within the lower cavity via the opening of the interface plate.

4. The node of claim 1, wherein the at least one RF connector port comprises a plurality of RF connector ports, each RF connector port of the plurality of RF connector ports having an electrical interconnect disposed in the first cavity of the first housing portion.

5. The node of claim 4, wherein the interface plate includes a plurality of apertures, each aperture of the plurality of apertures aligned with an associated electrical interconnect of the plurality of RF connector ports such that the associated electrical interconnect extends therethrough.

6. The node of claim 1, wherein the circuitry is a RF preamp and/or RF reverse amplifier.

7. The node of claim 1, wherein the amplifier includes a printed circuit board, and wherein the printed circuit board is mounted to a bottom surface of the second housing portion that defines the second cavity.

8. The node of claim 7, wherein an air gap is disposed between the printed circuit board and the bottom surface of the second housing portion to provide a direct thermal communication path from the printed circuit board to the bottom surface of the second housing portion.

9. The node of claim 8, wherein the printed circuit board is mounted at an overall offset distance OD2 from the bottom surface of the second housing portion to provide the air gap, the overall offset distance OD2 being 0.25±0.1 inches.

10. The node of claim 8, wherein the second housing portion defines a heatsink structure, and wherein the direct thermal communication path extends through the heatsink structure.

11. The node of claim 10, wherein the heatsink structure comprises fins.

12. The node of claim 7, wherein the first and second housing portions couple together and form an interface therebetween, and wherein a gap is disposed between the printed circuit board and the interface, the gap providing an overall offset distance OD1 of at least 3 inches.

13. The node of claim 12, wherein the gap is disposed between the printed circuit board and an interface plate disposed in the first cavity of the first housing portion, the interface plate providing thermal isolation and/or RF shielding between the printed circuit board and one or more components in the first housing portion.

14. The node of claim 1, wherein the first housing portion comprises a base and the second housing portion comprises a lid.

15. The node of claim 1, wherein the housing provides an ingress protection rating of at least 68 (IP68).

16. A node housing for use in a broadband distribution network, the node housing comprising:
  a first housing portion that defines a first cavity, the first cavity having an upper cavity and a lower cavity, and the first housing portion having at least one port for coupling to a feedline of a broadband distribution network;
  a second housing portion that defines a second cavity; and
  wherein:
    the first housing portion and the second housing portion are configured to couple together and collectively provide a component cavity therebetween, and wherein an overall volume V1 of the first cavity of the first housing portion is less than an overall volume V2 of the second cavity of the second housing portion;
    the second cavity of the second housing portion is configured to receive an amplifier;
    the lower cavity of the first housing portion is configured to receive a power supply;
    an interface plate disposed in the upper cavity and including an opening in communication with the lower cavity and configured to allow insertion of the power supply into the lower cavity, wherein the interface plate is configured to mount circuitry to provide an electrical passthrough arrangement that is configured to maintain power output to downstream nodes when the amplifier is electrically decoupled from the power supply; and
    the first housing portion includes a plurality of mounts for fixedly mounting the node housing to a wall or other suitable structure.

* * * * *